United States Patent [19]

Barlow et al.

[11] Patent Number: 5,032,486
[45] Date of Patent: Jul. 16, 1991

[54] METHOD FOR FORMING PRINTING PLATES AND PLATE-MAKING ELEMENT

[75] Inventors: Charles G. Barlow, St. Paul, Minn.; Michael G. Weeks, River Falls, Wis.

[73] Assignee: Minnesota Mining and Manufacturing Company, St. Paul, Minn.

[21] Appl. No.: 487,530

[22] Filed: Mar. 2, 1990

[51] Int. Cl.$^5$ .............................. G03C 5/54
[52] U.S. Cl. ............... 430/199; 430/202; 430/205; 430/916
[58] Field of Search .................. 430/199, 202, 205

[56] References Cited

U.S. PATENT DOCUMENTS

| | | | |
|---|---|---|---|
| 3,194,661 | 7/1965 | Cohen | 430/202 |
| 3,245,793 | 4/1966 | Smith | 96/35 |
| 3,687,667 | 8/1972 | Hayakawa et al. | 96/48 R |
| 3,697,275 | 10/1972 | Hayakawa et al. | 96/48 R |
| 3,746,542 | 7/1973 | Hayakawa et al. | 96/48 R |
| 3,756,818 | 9/1973 | Hayakawa et al. | 96/48 R |
| 3,756,820 | 9/1973 | Hayakawa et al. | 96/48 R |
| 3,767,400 | 10/1973 | Hayakawa et al. | 96/48 R |
| 3,782,943 | 1/1974 | Hayakawa et al. | 96/48 R |
| 3,782,944 | 1/1974 | Hayakawa et al. | 96/48 R |
| 3,790,378 | 2/1974 | Hayakawa et al. | 96/48 R |
| 3,874,947 | 4/1975 | Hayakawa et al. | 96/51 |
| 3,895,949 | 7/1975 | Akamatsu et al. | 96/86 P |
| 4,037,021 | 7/1977 | Adams | 428/522 |
| 4,134,769 | 1/1979 | Yoshida et al. | 96/76 R |
| 4,228,232 | 10/1980 | Rousseau | 430/271 |
| 4,268,609 | 5/1981 | Shiba et al. | 430/271 |
| 4,287,290 | 9/1981 | Mizuno et al. | 430/202 |
| 4,299,912 | 11/1981 | Shiba et al. | 430/302 |
| 4,335,197 | 6/1982 | Chambers et al. | 430/271 |
| 4,547,450 | 10/1985 | Maeda et al. | 430/202 |
| 4,557,997 | 12/1985 | Iwasaki et al. | 430/325 |

Primary Examiner—Richard L. Schilling
Attorney, Agent, or Firm—Gary L. Griswold; Walter N. Kirn; Robert H. Jordan

[57] ABSTRACT

A method for making printing plates wherein free radicals generated in a metallic silver image migrate into an image-receiving layer which comprises a free radical polymerizable polymer, thereby forming a printing image of hardened polymer in the image-receiving layer. Also, plate-making elements which may be used in such method to make lithographic printing plates.

21 Claims, 2 Drawing Sheets

METHOD FOR FORMING PRINTING PLATES AND PLATE-MAKING ELEMENT

FIELD OF INVENTION

The present invention relates to a method for forming lithographic printing plates, and also relates to a plate-making element for making lithographic printing plates.

BACKGROUND

Printing plates made using silver halide sensortype light-sensitive polymerizable materials have been proposed, as described in U.S. Pat. Nos. 3,687,667; 3,697,275; 3,746,542; 3,756,818; 3,756,820; 3,767,400; 3,782,943; 3,782,944; 3,790,378; and 3,874,947 (all Hayakawa et al). These patents disclose situations wherein an ethylenically-unsaturated compound is present in a processing solution or, if it is in the light sensitive material, in the same layer as the silver halide. In each of the references, polymerization of the vinyl compound is achieved by reducing the exposed silver halide in the presence of the compound.

When the silver halide emulsion and the ethylenically-unsaturated compound are in the same layer of a printing plate precursor, there are typically disadvantages. For instance, the thickness of the polymerizing layer is typically thicker because it must additionally contain silver halide material and binder colloid as well as the polymerizable material. Another disadvantage is that because the film typically swells substantially as developer solution penetrates to permit development of the silver halide, the resolution of the resultant printing image may be limited. Furthermore, because a hydrophilic binder must typically be incorporated in the emulsion to aid in dispersing the hydrophilic silver halide throughout the emulsion, the inking characteristics and printing durability of the resultant printing plates is typically inferior when using the polymer images formed therefrom as relief printing plates.

U.S. Pat. No. 3,245,793 (Smith) discloses a process for forming images wherein a developed silver halide image is used as a mask for imagewise irradiation of a layer containing a photopolymerizable non-gaseous ethylenically-unsaturated compound. U.S. Pat. Nos. 4,268,609 and 4,299,912 (both Shiba et al.) disclose similar mask techniques for formation of a printing image via photopolymerization.

U.S. Pat. No. 4,335,197 (Chambers et al.) discloses a method for producing a photopolymer image wherein a photosensitive element comprising a substrate coated with a photosensitive layer containing dispersed silver halide particles in operative association with a continuous film-forming phase of a defined polymeric coupler is used.

U.S. Pat. No. 4,547,450 (Maeda et al.) discloses a multilayer image-forming element in which a silver halide photographic emulsion and a polymerizable ethylenically-unsaturated compound are contained in adjacent layers. According to the reference, the polymerization reaction is initiated by an oxidized radical of a reducing agent that reduces the silver halide latent image.

U.S. Pat. No. 4,557,997 (Iwasaki et al.) discloses photopolymerizable compositions comprising silver halide, high molecular binder, and vinyl monomer. The silver halide is used as a photoinitiator.

SUMMARY OF INVENTION

The present invention provides a novel method that utilizes the high photosensitivity of silver-halide emulsions for producing durable printing plates. The present invention also provides novel silver halide-based plate-making elements that exhibit high photosensitivity and which may be used to make durable printing plates.

In brief summary, the method of the invention for making printing plates comprises:
a) providing a plate-making element that comprises a hydrophilic base sheet and a hydrophobic image-receiving layer, the image-receiving layer comprising at least one non-gaseous ethylenically-unsaturated oligomer which is polymerizable by free radicals;
b) providing a source image layer which comprises a developed, i.e., reduced, metallic silver source image, said source image being capable of generating free radical complexes when a silver-initiated free radical generator solution, referred to herein as a free radical generator solution, e.g., a pyrazine derivative free radical generator solution, is applied thereto;
c) arranging the source image layer in intimate contact with the image-receiving layer to provide an image transfer assembly;
d) applying free radical generator solution to the image transfer assembly thereby generating free radicals in the source image layer that migrate from the source image layer to the image-receiving layer such that the free radicals cause portions of the oligomer of the image-receiving layer to polymerize or crosslink in an imagewise fashion;
e) removing the source image layer; and
f) developing the image-receiving layer, i.e., removing the non-crosslinked portions thereof;

to provide a printing plate comprising a printing image, i.e., the polymerized or hardened portions of the oligomer of the image-receiving layer, on the base sheet.

Briefly summarizing, the plate-making elements of the invention comprise:
a) a base sheet, preferably flexible, comprising a hydrophilic printing surface; with
b) a hydrophobic image-receiving layer thereon, the image-receiving layer comprising at least one non-gaseous ethylenically-unsaturated oligomer which is polymerizable by free radicals; and on the image-receiving layer
c) a source image layer comprising an aqueous-permeable emulsion comprising a silver halide which can be exposed and developed to form a metallic silver image that upon exposure to a free radical generator solution will develop free radical complexes capable of migrating into the image-receiving layer in substantially imagewise fashion and causing substantially imagewise polymerization or hardening of the oligomer.

Such plate-making elements may be used in accordance with the method of the invention, or if desired, the novel method provided herein may be used to make a printing plate from an element consisting of a base sheet and an image-receiving layer as described above with a separate member bearing a developed silver image, e.g., a developed lith film, being used as the source image layer.

In accordance with the present invention, printing plates may be made which achieve the high photospeed and selective sensitivity associated with silver halide materials and which also achieve the high durability and press latitude associated with traditional metal base plates. Printing plates may be made using exposure sources providing as little as 5 milliwatts or less of power and exposure energies at the film plane of less than 5 ergs/centimeter$^2$.

BRIEF DESCRIPTION OF DRAWING

The invention will be further explained with reference to the drawing, wherein.

These figures, which are idealized, are not to scale and are intended to be merely illustrative and non limiting.

DETAILED DESCRIPTION OF PREFERRED EMBODIMENTS

Figure 1:
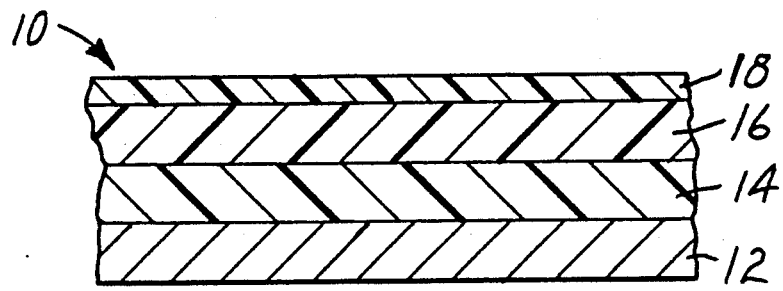
FIG. 1 shows in schematic cross-section a portion of one embodiment of a typical plate-making element of the invention.

FIG. 1 illustrates in schematic cross-section a typical embodiment of a plate-making element of the invention. Element 10 comprises base sheet 12, hydrophobic image-receiving layer 14, source image layer 16, and optional top coat 18.

The base sheet should be a material that is inherently hydrophilic or which can be conditioned to be hydrophilic. Illustrative examples of materials which can be used in base sheets of printing plates of the invention include aluminum, aluminum alloys, steel, steel alloys, zinc, iron, and polymer films, e.g., polyester, with hydrophilic coatings. If desired, laminates of such metals or of metal with paper or polymer films may also be used. Aluminum is generally preferred because such base sheets typically provide better adhesion of the resultant printing image, i.e., hardened portion of the image-receiving layer, thereto.

The base sheet preferably exhibits sufficient mechanical strength, e.g., tensile strength, impact resistance, etc., to permit the element to be handled during preparation and use as a printing plate. Also, it is typically preferred that the base sheet be somewhat flexible to facilitate handling and enable mounting on rotary presses. In some embodiments the base sheet will be magnetically attractable to facilitate printing presses adapted to use magnetic printing plate mounting means. The base sheet is preferably sufficiently dimensionally stable to resist undesireable stretching during printing which might tend to affect the accuracy of the printed image.

Depending upon the embodiment, the base sheet will typically be prepared by conventional means to render the surface of same hydrophilic, e.g., aluminum base sheets may be grained and anodized and/or silicated.

Image-receiving layer 14 is hydrophobic and comprises at least one ethylenically-unsaturated oligomer which may be selectively polymerized and rendered substantially insoluble by free radicals. In general, any free radical polymerizable composition which will yield a durable hydrophobic printing image may be used. The image-receiving layer is preferably substantially permeable to aqueous solutions so as to permit penetration by solutions containing free radicals as will be discussed below.

According to the present invention, polymerization of the oligomer in image-receiving layer 14 is achieved through action of free radicals generated in a metallic silver image, in contrast to many previously known systems wherein polymerization of the oligomer and formation of the printing image is carried out through photopolymerization action, i.e., photo-initiated cross-linking. In fact, in the present invention it is typically preferred that image-receiving layer 14 be substantially non-photopolymerizable, thereby facilitating handling and storage of same.

Nongaseous ethylenically-unsaturated oligomers which can be used in image-receiving layer 14 include those oligomers having at least one ethylenically-unsaturated group capable of addition polymerization which are liquid or solid at room temperature. Such oligomers may be used singly or in combination. Illustrative examples of useful oligomers include acrylamide, acrylonitrile, N-hydroxymethyl acrylamide, methacrylamide, N-t-butylacrylamide, methacrylic acid, acrylic acid, calcium acrylate, sodium acrylate, methyl methacrylate, methyl acrylate, ethyl acrylate, 2-acrylamide-2-methylpropanesulfonic acid, vinyl pyrrolidone, 2-vinylpyridine, 4-vinylpyridine, 2-methyl-N-vinylimidazole, potassium vinylbenzenesulfonate, and vinylcarbazole.

Oligomers having two or more ethylenically-unsaturated groups are particularly advantageous as the resultant printing images formed therefrom typically tend to exhibit greater durability. Such oligomers may be used instead of or together with the aforementioned oligomers which have a single ethylenically-unsaturated group. Oligomers having a plurality of ethylenically-unsaturated groups may be used singly or in combinations of two or more such oligomers. Illustrative examples of such oligomers include N,N'-methylenebisacrylamide, ethylene glycol dimethacrylate, diethylene glycol dimethacrylate, triethylene glycol dimethacrylate, polyethylene glycol dimethacrylate, divinyl ether, divinylbenzene, bisphenol A dimethacrylate, trimethylolpropane triacrylate, pentaerythitol tetraacrylate, bisoxyethylenated bisphenol A diacrylate, and dipentaerythitol hexaacrylate.

Urethane oligomers are typically preferred for use in the present invention as printing plates made with such oligomers typically exhibit good durability and inkability properties.

U.S. Pat. No. 4,228,232 (Rousseau) discloses a number of oligomers, and methods for making same, at column 3, line 57, through column 8, line 58, which could be used in the present invention. That portion of the reference is incorporated herein by reference.

Image-receiving layer 14 will comprise at least about 10 weight percent, typically between about 10 and about 60 weight percent, preferably between about 15 and about 45 weight percent, and more preferably between about 20 and about 35 weight percent, of oligomer.

Image-receiving layer 14 may comprise a binder, e.g., a natural or synthetic polymeric substance, which is preferably substantially insoluble in aqueous solutions but is capable of swelling sufficiently to permit penetration of the free radical generating solution therethrough to permit desired imagewise polymerization. Illustrative examples of natural polymeric substances which may be used as binders herein include gelatin, gelatin derivatives, gelatin graft polymers, polysaccharides such as starch or dextran, cellulose derivatives, and shellac. Illustrative examples of other polymeric substances which may be used as binders herein include homopolymers or copolymers of acrylic acid or methacrylic acid; free carboxylic acid group-containing polymers such as polymers of maleic acid, itaconic acid, vinylbenzoic acid, etc.; sulfonic acid group-containing polymers such as sodium styrenesulfonate copolymers, etc.; carboxylic acid anhydride group-containing polymers such as itaconic acid anhydride copolymers, etc.; novolak resins such as phenol-formaldehyde resin or cresolformaldehyde resin, etc.; hydroxy group-containing polymers such as polyhydroxystyrene, polyvinyl alcohol, vinyl alcohol copolymers, etc.; amide group-containing polymers such as polyamides, polyacrylamide or acrylamide copolymers, etc.; sulfonamide group-containing polymers such as styrenesulfonamide copolymers, etc.; polyvinyl pyrrolidone or vinylpyrrolidone copolymers; nylons such as copolymerized nylon or alcohol-soluble nylons such as methoxymethylate, nylon, etc.; polyvinyl acetals such as polyvinyl formal, polyvinyl butyral, etc.; hydroxyalkylcellulose, e.g., hydroxypropylcellulose; poly(vinyl methylether); polyvinylacetate, polyvinylacetate-polyvinylchloride copolymers; polyacrylates, e.g., polyalkylmethacrylates; and polyalkylene glycol. The aforementioned binder resins can be used singly or in mixtures of two or more.

Image-receiving layer 14 may be free of, but will typically comprise between about 10 and about 60, weight percent, preferably between about 15 and about 35 weight percent, and more preferably between about 20 and about 30 weight percent, of binder.

Image-receiving layer 14 may also comprise a free radical-polymerizable monomer component having one or more ethylenically-unsaturated groups such as acrylate, methacrylate, vinyl, and allyl. U.S. Pat. Nos. 3,895,949 and 4,037,021 disclose a number of free radical polymerizable monomers which are useful herein. Monomers which are preferred with the oligomers disclosed in the aforementioned U.S. Pat. No. 4,228,232 are compounds having multiple acrylate and methacrylate groups, e.g., acrylic esters of low molecular weight polyols, such as trimethylolpropanetriacrylate, pentaerythritol tetraacrylate and triacrylate, etc. The molecular weight of such monomers are preferably less than about 2,000 and more preferably less than about 1,000.

Image-receiving layer 14 may be free of such monomers, but in some embodiments will comprise up to about 60 weight percent, typically between about 25 and about 50 weight percent, of such monomer components.

If desired, plasticizers may be added to image-receiving layer 14 to adjust the hardness and flexibility thereof. Illustrative examples of useful plasticizers include phthalic acid esters such as dimethyl phthalate, diethyl phthalate, dibutyl phthalate, dissobutyl phthalate, dioctyl phthalate, octylcapryl phthalate, dicyclohexyl phthalate, ditridecyl phthalate, butyl benzyl phthalate, diisodecyl phthalate, diallyl phthalate, etc.; glycol esters such as dimethyl glycol phthalate, ethylphalyl ethyl glycol, methylphthalyl ethyl glycol, butylphalyl butyl glycol, triethylene glycol dicaprylate, etc.; phosphoric acid esters such as tricresyl phosphate or triphenyl phosphate, etc.; aliphatic dibasic acid esters such as diisobutyl adipate, dioctyl adipate, dimethyl sebacate, dibutyl sebacate, diisoctyl azelate, etc.; triethyl citrate, glycerol triacetyl ester; and butyl laurate.

Various known surface active agents, e.g., surfactants, wetting agents, etc., may be added to image-receiving layer 14 to improve the coating characteristics of the composition from which the layer is formed. If desired, one or more plasticizing agents may be added to image-receiving layer 14, however, typically layer 14 is sufficiently flexible without such agents Optimum amounts of such agents may be readily determined by trial and error, but such agents are not functionally required for practice of the invention.

In order to prevent disadvantageous thermal polymerization of the oligomer in image-receiving layer 14 during preparation or storage of same, it may be desirable to incorporate one or more thermal polymerization inhibitors therein. Illustrative examples of such inhibitors include hydroquinone p-methoxyphenol, di-t-butyl-p-cresol, pyrogallol, t-butylcatechol, benzoquinone, cuprous chloride, phenothiazine, chloranil, alpha naphthylamine, beta-naphthol, nitrobenzene, and dinitrobenzene. Optimum amounts of thermal inhibitors may be readily determined by trial and error.

If desired, coloring agents such as dyes or pigments may be incorporated in either image-receiving layer 14 or source image layer 16 to facilitate visual inspection thereof during manufacture of a printing plate in accordance with the present invention. Optimum amounts of such coloring agents may be readily determined by trial and error.

Typically, image-receiving layer 14 is preferably substantially free of free radical trapping agents such as azo type dyes which might tend to undesirably interfere with the desired free radical generation, migration, and initiation of polymerization upon which the present invention relies.

Generally, the image-receiving layer compositions of the invention are prepared by mixing the components in a suitable solvent. For instance, low boiling, i.e., boiling point of less than about 150° C. at atmospheric pressure, polar solvents that are not reactive with carboxyl groups or ethylenically-unsaturated groups, such as methanol, ethanol, propanol, acetone, methylethyl ketone, tetrahydrofurane, or mixtures thereof are typically useful with oligomers such as those disclosed in the aforementioned U.S. Pat. No. 4,228,232. The amount of solvent used depends upon the desired viscosity of the composition and the desired thickness of the resultant image-receiving layer, and may be readily determined by trial and error.

Image-receiving layer 14 is then typically coated onto base sheet 12 by known coating techniques. Optimum thickness of the resulting layer will depend in part upon the specific application for which the resultant printing plate will be used. Typically, composition coating weights of about 0.3 to about 9 grams/meter$^2$ (on solvent-free basis) will be useful. It will be understood, however, that image-receiving layers formed with composition coating weights and resultant thicknesses outside this range will also be useful in accordance with the present invention. The optimum thickness for image-receiving layer 14 and resultant printing image 24 will be dependent in part upon the type of press for which the printing plate is being prepared and the desired press life.

Following imagewise hardening as discussed below, the hardened portions, i.e., printing image 24, of image-receiving layer 14 preferably have a Shore D Hardness of between about 50 and about 90. Printing images having hardnesses outside this range may be used. Typically, however, as printing image 24 is increasingly softer, the resultant plate tends to have a shorter press life, and as printing image 24 is increasingly harder, the resultant plate may tend to be more brittle and perhaps tend to crack when flexed for mounting on a press or during use. Optimum hardnesses for a particular application and formulation of an appropriate image-receiving layer composition, e.g., choice of oligomer and incorporation of plasticizer, to achieve same may be readily determined by trial and error. Resultant printing image 24 is preferably substantially insoluble to aqueous solutions, press chemicals, blanket washes, fountain solutions, inks, cleaning solvents, etc., or at least sufficiently so as to withstand exposure thereto during printing operations without undesirable degradation of image quality and durability.

Source image layer 16 should also be permeable to aqueous solutions. In particular, the free radical generating solution must be able to penetrate therethrough, react with metallic silver source image 22 to generate the desired free radicals, and then flow into image-receiving layer 14 such that the free radicals can penetrate thereinto to polymerize the oligomer and monomer (if any) and form printing image 24. Source image layer 16 comprises an emulsion of silver halide dispersed in a hydrophilic colloid, e.g., gelatin, that upon exposure to actinic radiation and development forms a metallic silver image. The metallic silver image is used herein to catalyze formation of free radical complexes in a free radical generator solution. The generated complexes are preferably water soluble to facilitate imagewise migration from source image layer 16 to image-receiving layer 14, thereby enabling high resolution of the resultant printing image to be achieved.

Useful silver halide emulsions include silver chloride, silver bromide, silver chlorobromide, or silver iodobromide emulsions. Typically, the preferred emulsion is a high contrast silver chlorobromide emulsion wherein the silver halide is about 75 mole percent chloride and about 25 mole percent bromide.

Either negative-type or direct-positive silver halide emulsions may be used with the present invention. The crystalline form of the silver halide grains is not critical and the grains may be monodispersed or polydispersed grains and, furthermore, may be core-shell type grains or tablet grains.

As is known in the art, the silver halide emulsion may contain heavy metals such as rhodium salts, iridium salts, palladium salts, ruthenium salts, etc., to control contrast and reciprocity failure.

An advantage of silver halide emulsions is the high photosensitivity to desired wavelengths or wavelength ranges of actinic radiation which may be achieved therewith. As is known in the art, such emulsions may be sensitized with various sensitizing agents to provide sensitivity to desired wavelengths and in some instances, such emulsions may be rendered substantially insensitive to certain wavelengths. Accordingly, plate-making elements of the invention may be used to make printing plates with any of a variety of exposure means as desired. Thus, in plates of the invention, the silver halide grains may be orthochromatically or panchromatically sensitized, and may be sensitized for exposure by, for instance, helium-neon laser, argon laser, light-emitting diode, semiconductor laser, visible light, infrared light, and ultraviolet light. Furthermore, if desired, the silver halide grains may be desensitized to certain wavelengths and sensitized to others, e.g., desensitized to visible light but sensitized to ultraviolet radiation to permit ordinary uncovered handling of unexposed plates under ordinary room light. Silver halide grains may be positively or negative sensitized with organic sensitizing dyes such as cyanine or hemicyanine dyes. U.S. Pat. No. 4,134,769 (Yoshida et al.) discloses some illustrative examples of sensitizing dyes that may be used in imaging layers of printing plate elements of the invention.

As is known to those skilled in the art, silver halide grains may be sensitized by various techniques at the time of preparation or coating. For example, silver halide grains may be chemically sensitized by well known methods such as with sodium thiosulphate or alkyl thiourea, and/or gold compounds such as gold chloride.

Some of the types of gelatin useful in source image layer 16 include, but are not limited to, lime treated gelatin, acid treated gelatin, and deionized gelatin.

Source image layer 16 may contain one or more other property enhancing agents, e.g., wetting agents, preferably anionic or nonionic, such as AEROSOL TO from American Cyanamid, saponin, TRITON X100 from Rohm and Haas, TERGITOL NPX from Union Carbide, etc.; hardeners such as formaldehyde, dimethylolurea, triazines, vinyl sulphones, etc.; gel extenders; and others. Optimum amounts of such agents for a particular application can be readily determined by trial and error. For instance, although source image layer 16 may typically contain between about 1 and about 10 parts by weight of hardener per 100 parts gelatin, amounts outside this range will be useful in some instances.

If desired, source image layer 16 may comprise a binder such as those described above with regard to image-receiving layer 14. If desired, source image layer 16 may also comprise one or more plasticizers.

The useful thickness of source image layer 16 for a particular application may be readily determined by trial and error. Generally, source image layer 16 may be of any thickness such that, once the image is developed therein, a sufficient quantity of metallic silver is present to generate a large enough quantity of free radicals when the free radical generating solution is applied to cause polymerization of the oligomer and monomer, if any, in image-receiving layer 14. If source image layer 16 is excessively thick, penetration of the free radical generating solution therethrough may be impeded and resolution of resultant printing image 24 may be impaired. Typically, source image layers 16 which contain a silver basis weight of between about 5 and about 50 milligrams/decimeter$^2$ will be useful. It will be understood, however, that source image layers having silver contents outside this range will also be useful in some embodiments.

If desired, plate-making elements of the invention may further comprise an optional top coat over source image layer 16 on the opposite side thereof from underlying image-receiving layer 14. Such a top coat (18 in FIGS. 1-3), which in some instances is made of gelatin, may be employed to improve resistance to abrasion, etc. It will typically contain gelatin or other polymer material, e.g., polyvinyl alcohol. In order to facilitate exposure of source image layer 16, top coat 18 is preferably substantially transparent to at least the wavelength of radiation by which the element is to be exposed. Typically, optional top coat 18 is between about 1 and about 5 microns thick although top coats having thicknesses outside this range may be used.

Figure 2:
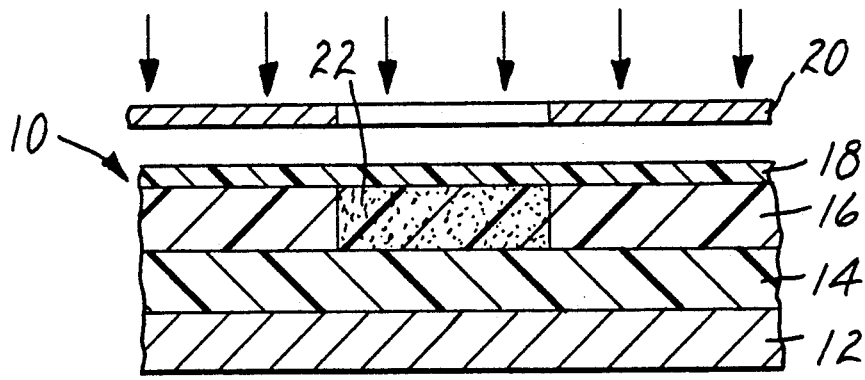
FIGS. 2–4 show in schematic cross-section the same portion of plate-making element through sequential steps of the method of the invention.

A printing plate may be made by the novel method of the present invention from the novel plate-making element described above as follows. First, as shown in FIG. 2, element 10 is exposed in imagewise fashion to actinic radiation, such as by exposure of radiation from a source such as a low power, e.g., 5 milliwatt, laser (not shown) through mask 20. Alternatively, element 10 could be exposed by selectively scanning (not shown) in imagewise fashion, e.g., with a laser. Illustrative examples of actinic radiation sources that may be used include ultraviolet lamps, infrared lamps, laser diodes, visible light lamps, etc., depending upon the sensitivity of the particular source image layer 16 used. As mentioned above, an advantage of the present invention is that source image layer 16 contains an emulsion of silver halides which can be selectively sensitized to desired exposure techniques, thereby lending great flexibility to the practitioner. For instance, in some embodiments, element 10 may be exposed with energies at the surface of the element, i.e., "film plane level", of less than about 10 ergs/centimeter$^2$ or even about 2 ergs/centimeter$^2$.

Following exposure of source image layer 16, it is developed, e.g., by ordinary hydroquinone photographic developers, to form metallic silver image 22 therein as shown in FIG. 2. Metallic silver image 22 in source image layer 16 is subsequently used to generate the desired free radical complexes in a free radical generator solution containing pyrazines or quinoxalines.

After development of metallic image 22 in source image layer 16, plate making element 10 is typically rinsed with water to stop the developer action and remove residual developer. Typically, developer solutions tend to be somewhat alkaline, and in such instances plate-making element 10 is rinsed with a mild acid solution to fully neutralize the developer.

Plate-making element 10, also referred to as an integral image transfer assembly, is then immersed in a free radical generator solution (not shown). The catalyst in the generator solution and metallic silver image 22 interact to form migratory free radical complexes. The following is believed to be an illustrative reaction:

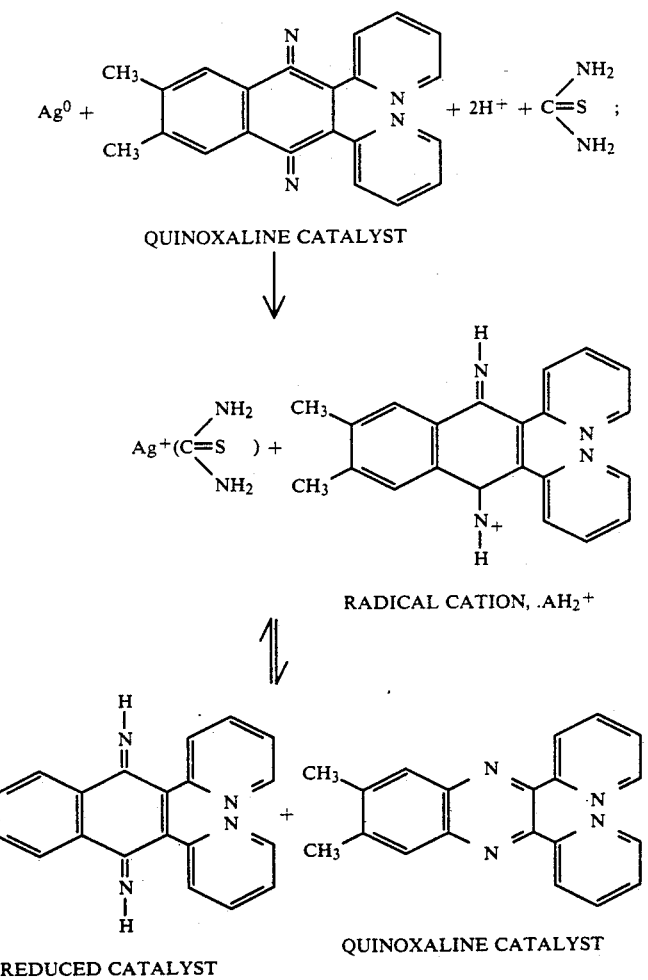

Figure 3:
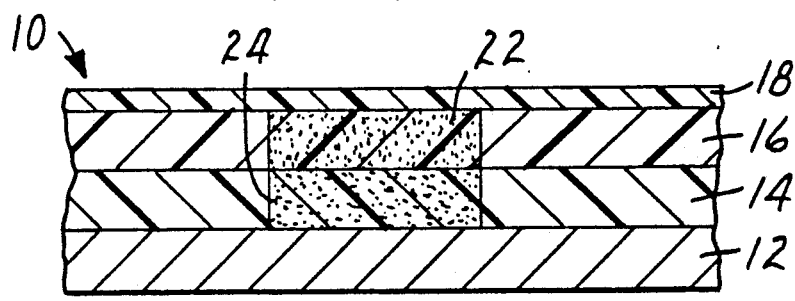

While in the free radical generator solution bath, because source image layer 16 and image-receiving layer 14 are both permeable, at least some of the free radical complexes migrate from source image layer 16 into image-receiving layer 14. As shown in FIG. 3, upon migrating from source image 22 into image-receiving layer 14, the free radical complexes cause those portions of the oligomer and monomer, if any, within image-receiving layer 14 to polymerize and thereby become relatively insoluble. The portions of image-receiving layer 14 which are rendered insoluble form printing image 24.

Free radical generating solutions used in the method of the invention may be similar to conventional silver dye bleach baths. They are commonly acidic in nature, which it is believed may in some instances facilitate protonation of the catalyst to form the free radical. It will be understood, however, that free radical generating solutions which do not require such a low pH to achieve protonation may be used herein. Accordingly, the catalyst typically preferably exhibits high stability under highly acidic conditions, e.g. when the free radical generator solution has a pH below about 2.0 when such solutions are used. The catalyst or catalysts therein should form a radical upon contact with silver that has a sufficiently long life to be able to migrate from the image layer into the image-receiving layer and to initiate polymerization therein.

Selection of the catalyst is also based in part upon the oligomer used in image-receiving layer 14, with a catalyst which is compatible with the oligomer, i.e., that will form a radical which will effectively polymerize the oligomer, being preferred. Useful combinations of catalysts and oligomers may be readily determined by trial and error. Some illustrative examples of catalysts which may be used in generator solutions of the invention include pyrazine, quinoxaline, 2,3-dimethyl quinoxaline, 6,7-dimethyl-2,3-di(pyridyl)quinoxaline, phenazine, 2 hydroxy-3-amino phenazine, and 3-hydroxy-4-amino-naphthazine-5-sulphonic acid. A typically preferred catalyst for use with the oligomers disclosed in the aforementioned U.S. Pat. No. 4,228,232 (Rousseau) is 6,7-dimethyl-2,3-di(pyridyl)quinoxaline which is highly soluble in low pH solutions, readily protonates under such conditions, and forms stable free radicals which can migrate as necessary to form printing image 24.

Pyrazine derivative, quinoxaline derivative, and phenazine derivative catalysts are typically preferred as the free radicals generated therewith tend to exhibit long lives, thereby tending to provide effective migration into the image-receiving layer and desired polymerization therein.

The optimum concentration of the catalyst in the free radical generating solution is dependent in part upon the particular catalyst or combination of catalysts which is used and the oligomer in image-receiving layer 16. In many instances, the catalyst is present as about 0.1 to about 0.5 weight percent of the free radical generating solution. Typically, if the solution contains too little catalyst, polymerization of the oligomer may proceed undesirably slowly, which may result in impaired resolution. In many instances, the upper limit of catalyst concentration is substantially determined by the solubility characteristics of the catalyst itself.

Source image layer 16 is then removed, typically by treating plate-making element 10 with hot water to the dissolve the silver halide emulsion.

The unpolymerized, i.e., nonimage, portions of image-receiving layer 14 are then removed, typically by treating element 10 with an aqueous alkaline bath, e.g., an aqueous solution of 4 weight percent N-propanol, 2 weight percent sodium metasilicate, and 0.6 weight percent DOW FAS 2A-1 (from Dow Chemical).

Figure 4:
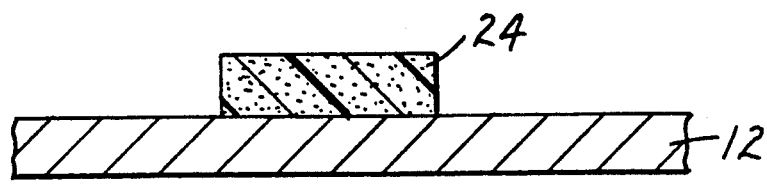

FIG. 4 illustrates in schematic cross-section completed printing plate 26 which comprises hydrophilic base sheet 12 and hydrophobic printing image 24.

The resultant plate may be treated with conventional techniques, e.g., gumming, to improve press performance or for storage, e.g!, treated with gum arabic.

Figure 5:
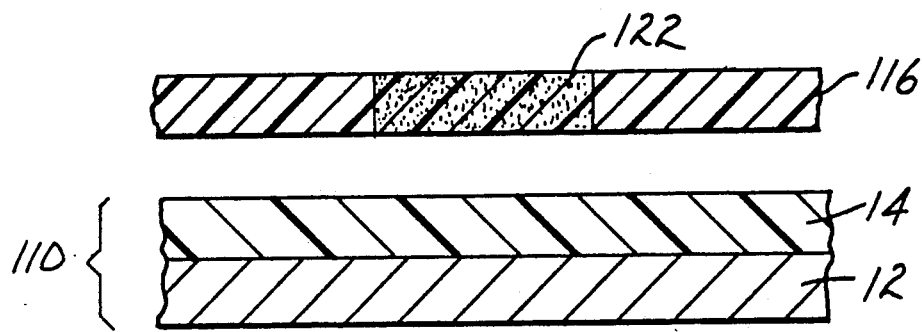
FIGS. 5–7 show in schematic cross-section a portion of another embodiment of a plate-making element and a separate source image layer through sequential steps of the method of the present invention.
Figure 6:
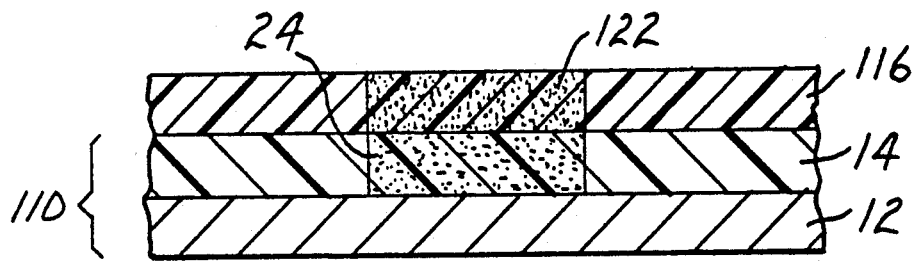
Figure 7:
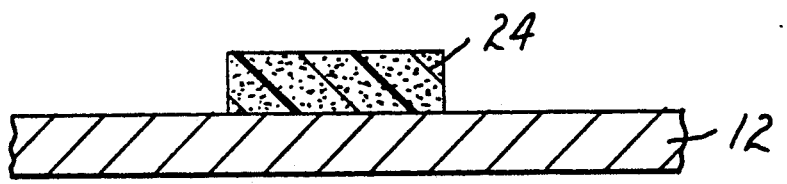

As shown in FIGS. 5-7, the method of the invention may be used to make printing plates from films bearing silver images, e.g., a lithfilm positive. FIG. 5 illustrates modified element 110 which comprises base sheet 12 and image-receiving layer 14 such as described above. Provided separately is image source 116 bearing silver image 122. Collectively, image source 116 and element 110 constitute an image transfer assembly.

As shown in FIG. 6, image source 116 is placed in intimate contact with image-receiving layer 14 of element 110, with both image source 116 and image-receiving layer 14 being well wetted with free radical generator solution. Typically, moderate pressure is applied to ensure that image source 116 and image-receiving layer 14 are in intimate contact with substantially no gaps therebetween. Such gaps may interfere with migration of the free radicals from image source 116 to image-receiving layer 14, thereby impairing the accuracy and resolution of resultant printing image 24. Typical means for applying such pressure is to place image source 116 and element 110 in desired position and to pass them between a pair of nip rollers. Free radicals are generated in source image 116 and migrate into image-receiving layer 14, causing imagewise polymerization to form printing image 24.

Image source 116 can then be separated from element 110 and the unpolymerized portions of image-receiving layer 14 removed, e.g., by treating with an alkaline bath as discussed above, to yield a printing plate comprising hydrophilic base sheet 12 and hydrophobic printing image 24 as shown in FIG. 7. An advantage of the present invention is that, because only small amounts of the total silver in metallic silver image 122 are typically used to generate the necessary free radicals, image source 116 can typically be reused several times to make several printing plates with the same printing image thereon.

Another of the advantages of the present invention is that a new printing plate can be made under ordinary ambient lighting conditions without special light-shielded handling because formation, i.e., polymerization, of the printing image is not itself light-initiated. Preferably, the image-receiving layer is substantially non-photopolymerizable. For instance, a previously prepared and proofed lith-film may be used as the source image and used to prepare several new printing plates as needed without requiring resort to special light conditions which would be needed to prevent undesirable non-imagewise polymerization of the printing image in plate-making elements wherein the polymerizable layer is light-sensitive.

Printing images having fine resolution and high durability may be made in accordance with the present invention. For instance, plates with a printing image containing 5 to 95 percent half tone image from a 150 lines-/inch screen can be easily made and used to make several thousand copies.

EXAMPLES

The invention will be further explained by the following illustrative examples which are intended to be nonlimiting. Unless otherwise indicated, all amounts are expressed in parts by weight.

Except as indicated below, in Examples 1-6, the silver halide emulsion was as follows. The emulsion contained mono-dispersed silver bromo-chloride (25:75 weight ratio Br:Cl) with an average grain size of about 0.35 microns in gelatin. The emulsion was optimally sensitized with N-methyl thiosuccinimide and sodium tetrachloro-aurate, with appropriate sensitizing dyes being added to confer sensitivity to the indicated exposure source. The emulsion also contained 2 parts of chitosan per 80 parts of emulsion, tetra-azaindene as a stabilizer, surfactant (AEROSOL TO, 15 milliliters of 1.3 weight percent solution per 80 grams of emulsion), chrome alum (15 milliliters of 5 weight percent solution per 80 grams of emulsion), and hardener (formaldehyde,m 15 milliliters per 80 grams of emulsion). Unless otherwise indicated, the emulsion was coated to provide a source image layer having a basis weight (as silver) of about 20 milligrams/decimeter$^2$.

The photographic developer used in each Example was KODAK D19 Photographic Developer. Unless otherwise indicated, the plate developer used to remove the unhardened portions of the image-receiving layer in each example was a solution of:

| Amount | Component |
|--------|-----------|
| 20.0   | sodium metasilicate; |
| 40.0   | n-propanol alcohol; |
| 0.6    | DOW FAX 2A-1; and |
| 939.0  | Water. |

EXAMPLE 1

A 6 mil (150 micron) thick sheet of grained and anodized aluminum was used as the base sheet. The base sheet was hand coated with the following composition:

| Amount | Component |
|--------|-----------|
| 4.36 | SR 295 - pentaerythitol tetraacrylate monomer from Sartomer; |
| 5.68 | Oligomer - carboxyl substituted urethane oligomer, disclosed as Preparation II in U.S. Pat. No. 4,228,232 (Rousseau), 60 weight percent solution in methyl ethyl ketone; |
| 0.30 | Tri-ethylamine - to neutralize acid groups on oligomer making same more compatible in aqueous solution; |
| 76.42 | Aqueous propanol azeotrope - solvent; |
| 14.24 | Pigment/Binder - 1:2 weight ratio of copper phthalocyanine pigment in FORMVAR 12/85, formaldehyde/polyvinyl alcohol copolymer from Monsanto; |
| 0.40 | Diphenyl iodonium salt - free radical transfer agent; | at a coating weight of about 170 milligrams/foot$^2$ (1800 milligrams/meter$^2$) to provide an image-receiving layer.

An orthochromatic emulsion was coated onto the aforementioned coating.

The element was then exposed in a graphic arts camera at f22 for 10 seconds to an image of type and half tones, developed for 2 minutes in D19, stopped in a dilute acetic acid bath for 15 seconds, and then immersed in a free radical generating solution consisting of 250 milliliters of 2N sulfuric acid, 250 milliliters of 1N potassium iodide, and 0.2 grams of quinoxaline diol for 5 minutes.

The emulsion, i.e., image source layer, was easily washed off with hot water and the non-image, i.e., unhardened, areas of the image-receiving layer removed with plate developer.

An oleophilic hardened polymer image, i.e., printing image, of both type and half tones remained on the oleophilic aluminum base sheet. The resultant plate was used on a printing press and printed cleanly for more than 500 impressions.

EXAMPLE 2

Example 1 was repeated except the free radical generating solution consisted of 500 milliliters of 2N sulfuric acid, 15 grams of thiourea, and 0.3 grams quinoxaline diol.

Similar results to those in Example 1 were obtained.

EXAMPLE 3

Example 2 was repeated except 1.0 gram of 6,7-dimethyl dipyridyl quinoxaline was used in place of the quinoxaline diol in the free radical generating solution.

The resultant printing image was stronger and more resistant to abrasion.

EXAMPLE 4

Example 3 was repeated except the chitosan in the emulsion of the source image layer was replaced with butyl acrylonitrile methacrylate, a terpolymer latex.

Better adhesion of the source image layer to the underlying image-receiving layer was observed.

The resultant printing plate provided similar results as were obtained in Example 3.

EXAMPLE 5

Example 3 was repeated except the emulsion of the source image layer was spectrally sensitized to 633 nanometers and the plate-making element was exposed with a Helium/Neon laser providing an exposure energy of about 2 ergs/centimeter$^2$ to form the source image in the source image layer.

A printing image of hardened resin in the form of the laser written image was formed. The resultant printing plate provided similar results as were obtained in Example 3.

EXAMPLE 6

Example 3 was repeated except the emulsion of the source image layer was sensitized to a wavelength of about 488 nanometers. The plate-making element was scanned with an argon laser emitting a beam of that wavelength to yield an image consisting of letter and half-tone dots having a resolution of about 140 lines/inch to provide an exposure energy of about 10 ergs/centimeter$^2$.

The resultant printing plate provided similar results as were obtained in Example 3.

EXAMPLE 7

Example 6 was repeated except the emulsion of the source image layer was sensitized to a wavelength of about 820 nanometers and the plate-making element was exposed with a laser image emitting a beam of that wavelength providing an exposure energy of about 50 ergs/centimeter$^2$.

The resultant printing plate provided similar results as were obtained in Example 3.

EXAMPLE 8

A commercial silver halide lith film was exposed, developed to form a metallic silver image, and treated with a stop bath, fixed, rinsed, and dried to yield an image source.

A free radical generating solution was prepared by dissolving the following in sufficient water to yield 1000 milliliters (amounts are in grams):

| Amount | Component |
|---|---|
| 50.0 | concentrated sulfuric acid; |
| 48.0 | thiourea; |
| 3.2 | 6,7-dimethyl-2,3-di(pyridyl)quinoxaline; |
| 2.0 | 4-mercapto butyric acid; |
| 7.0 | nitrobenzene sulphonic acid; |
| 6.0 | benzotriazole; |
| 4.0 | phenidone; |

The latter four components were added to improve image resolution.

This solution was placed in the tank of a YRAPID PC-38 Diffusion Transfer Processor from Agfa Gevaert.

An aluminum base sheet with an image-receiving layer thereon and the image source were simultaneously fed into the processor as an image transfer assembly where they were immersed in the free radical generator solution and then passed through rollers to achieve intimate contact. After about 60 seconds, the two sheets were peeled apart.

The printing plate element, i.e., base sheet and image receiving layer, was then treated with the aforementioned plate developer to remove the unpolymerized portions of the image-receiving layer. The resultant printing image looked very sharp with excellent gradation of tone.

The source image was used to make at least six (6) printing plates, all having good appearance, in the same manner and did not appear to suffer any degradation. The source image could apparently have been used to make many more printing plates if desired.

Various modifications and alterations of this invention will become apparent to those skilled in the art without departing from the scope and spirit of this invention.

What is claimed is:

1. A method for making a printing plate comprising:
  a) providing a plate-making element that comprises a hydrophilic base sheet and a hydrophobic image-receiving layer, said image receiving layer comprising at least one ethylenically-unsaturated oligomer which is polymerizable by free radicals;
  b) providing a source image layer which comprises a developed metallic silver source image, said source image being capable of generating free radical complexes when a free radical generator solution is applied thereto;
  c) arranging said source image layer in intimate contact with said image-receiving layer to provide an image transfer assembly;
  d) applying free radical generator solution to said image transfer assembly thereby generating free radicals in said source image layer that migrate from said source image layer to said image-receiving layer such that said free radicals cause portions of said oligomer of said image-receiving layer to polymerize in an imagewise fashion, said free radical generator solution being acidic and comprising at least one of the following catalysts: pyrazine derivatives, quinoxaline derivatives, and phenozine derivatives;
  e) removing said source image layer; and
  f) developing said image-receiving layer; to provide a printing plate comprising a printing image on said base sheet.

2. The method of claim 1 wherein said base sheet comprises at least one of the following: aluminum, aluminum alloy, steel, steel alloy, zinc, iron, laminates of metals, laminates of metal with paper, laminates of metal with polymer film, or polymer film.

3. The method of claim 1 wherein said source image layer is an aqueous-permeable emulsion containing one or more silver halides.

4. The method of claim 3 wherein said emulsion comprises silver halides in a ratio of about 75 mole percent silver chloride and about 25 mole percent silver bromide.

5. The method of claim 1 wherein said source image layer is exposed with at least one of the following prior to development to form said metallic silver image: visible light, infrared light, ultraviolet light.

6. The method of claim 1 wherein said source image layer contains one or more of the following: gelatin, heavy metal, binder, plasticizer, surface active agent, hardener, gel extender, sensitizing agent, or coloring agent.

7. The method of claim 1 wherein said image-receiving layer comprises urethane oligomers.

8. The method of claim 1 wherein said image-receiving layer forms a printing image having a Shore D Hardness of between about 50 and about 90 following polymerization by said free radicals.

9. The method of claim 1 wherein said image-receiving layer contains one or more of the following: binder, plasticizer, surface active agent, hardener, coloring agent, or thermal polymerization inhibitor.

10. The method of claim 1 wherein said image-receiving layer comprises up to about 60 weight percent of free radical-polymerizable monomer.

11. The method of claim 1 wherein said image-receiving layer comprises at least about 10 weight percent of said oligomer, between about 10 and about 60 weight percent of binder, and between about 10 and about 60 weight percent of free radical-polymerizable monomer.

12. The method of claim 1 wherein at least one of said image-receiving layer or said source image layer contains a free radical transfer agent.

13. The method of claim 1 wherein said free radical generator solution has a pH below about 2.0.

14. The method of claim 1 wherein said base sheet image-receiving layer, and source image layer are integral transfer assembly.

15. The method of claim 1 wherein said silver-initiated free radical generator solution comprises between about 0.1 and about 0.5 weight percent of said catalyst.

16. The method of claim 1 wherein said free radical generator solution comprises at least one of the following catalysts: pyrazine, quinoxaline, 2,3-dimethyl quinoxaline, 6,7-dimethyl-2,3-di(pyridyl)quinoxaline, phenazine, 2 hydroxy-3-amino phenazine, or 3-hydroxy-4-amino-naphthazine-5-sulphonic acid.

17. The method of claim 1 wherein said source image layer is an integral part of said printing plate element and wherein said printing plate element is imagewise exposed with actinic radiation and then developed to form said metallic silver image.

18. The method of claim 17 wherein said printing plate element further comprises a top coat over said source image layer.

19. The method of claim 1 wherein said image-receiving layer is substantially non-photopolymerizable.

20. The method of claim 1 wherein said source image layer is a lith film.

21. The method of claim 1 further comprising applying pressure to said printing plate element and said source image layer to provide intimate contact therebetween.

* * * * *

UNITED STATES PATENT AND TRADEMARK OFFICE
CERTIFICATE OF CORRECTION

PATENT NO. : 5,032,486

DATED : July 16, 1991

INVENTOR(S) : Charles G. Barlow and Michael G. Weeks

It is certified that error appears in the above-identified patent and that said Letters Patent is hereby corrected as shown below:

On the title page, item [54], and in column 1, line 3:
      In the title, delete the words "AND PLATE-MAKING ELEMENT".

In Col. 6, Line 9, insert a period after the word "agents".

In Col. 6, Line 20, insert a hyphen after the word "alpha".

In Col. 8, Line 24, "AEROSOL TO" should read --AEROSOL OT--.

In Col. 11, Line 53, delete the last word "the".

In Col. 11, Line 66, delete the exclamation point after "e.g." and insert a comma.

In Col. 12, Line 1, the word "lithfilm" should read --lith film--.

In Col. 13, Line 4, "AEROSOL TO" should read --AEROSOL OT--.

In Col. 13, Lines 7-8, "formaldehyde,m" should read --formaldehyde--.

In Col. 13, Line 11, delete the comma after the word "decimeter$^2$" and insert a period.

In Col. 15, Line 13, "YRAPID" should read --COPYRAPID--.

UNITED STATES PATENT AND TRADEMARK OFFICE
CERTIFICATE OF CORRECTION

PATENT NO.  :  5,031,486

DATED       :  July 16, 1991

INVENTOR(S) :  Charles G. Barlow and Michael G. Weeks

It is certified that error appears in the above-identified patent and that said Letters Patent is hereby corrected as shown below:

In Col. 15, Line 41, insert a hyphen between the words "image" and "receiving".

Signed and Sealed this

Fifth Day of January, 1993

Attest:

DOUGLAS B. COMER

Attesting Officer

Acting Commissioner of Patents and Trademarks